(12) United States Patent
Tsai et al.

(10) Patent No.: US 7,253,662 B2
(45) Date of Patent: Aug. 7, 2007

(54) METHOD FOR FORMING AN ELECTRIC DEVICE COMPRISING POWER SWITCHES AROUND A LOGIC CIRCUIT AND RELATED APPARATUS

(75) Inventors: Yu-Wen Tsai, Hsin-Chu (TW); Cheng-I Huang, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 197 days.

(21) Appl. No.: 10/907,957

(22) Filed: Apr. 22, 2005

(65) Prior Publication Data

US 2006/0237834 A1    Oct. 26, 2006

(51) Int. Cl.
*H03K 19/00* (2006.01)

(52) U.S. Cl. .......................................... 326/101; 326/33

(58) Field of Classification Search .................. 326/38, 326/47, 101, 31, 33
See application file for complete search history.

(56) References Cited

U.S. PATENT DOCUMENTS

| | | | |
|---|---|---|---|
| 6,239,614 B1* | 5/2001 | Morikawa | 326/39 |
| 7,098,689 B1* | 8/2006 | Tuan et al. | 326/44 |
| 2005/0218959 A1* | 10/2005 | Yamawaki et al. | 327/334 |

* cited by examiner

*Primary Examiner*—James H. Cho
(74) *Attorney, Agent, or Firm*—Winston Hsu

(57) ABSTRACT

A method for forming an electric device having power switches around a logic circuit including: forming a logic circuit on a substrate; forming a plurality of power switches around the logic circuit; and coupling first ends of the power switches to a voltage end, and coupling second ends of the power switches to a power receiver of the logic circuit.

16 Claims, 7 Drawing Sheets

METHOD FOR FORMING AN ELECTRIC DEVICE COMPRISING POWER SWITCHES AROUND A LOGIC CIRCUIT AND RELATED APPARATUS

BACKGROUND OF INVENTION

1. Field of the Invention

The present invention provides a method for forming an electric device having power switches, and more particularly, a method for forming the power switches around a logic circuit of the electric device.

2. Description of the Prior Art

Integrated circuits (ICs) have been highly developed. Personal computers, mobile phones, watches, and calculators, for example, are applications of ICs. ICs with small area, low power consumption, and simple manufacturing procedures are principle points for research and development departments of IC manufactories. Therefore, in order to save energy, a layout of an IC usually requires power switches for controlling power supply. There are a lot of designs of power switches in the prior art, such as a MOSFET (metal oxide semiconductor field effect transistor), which is taken as a power switch of a low power circuit.

Please refer to FIG. 1, which illustrates a schematic diagram of a prior art layout 10 using MOSFETs as power switches. The layout 10 includes a logic circuit 12, a p-type MOS 14, an n-type MOS 16, and a control circuit 18. The logic circuit 12 performs operations. The p-type MOS 14 and the n-type MOS 16 controlled by the control circuit 18 turn on to provide power for the logic circuit 12, or cut off to stop providing power. Therefore, when it is not necessary for the logic circuit 12 to perform any operation, the control circuit 18 controls the p-type MOS 14 and the n-type MOS 16 to stop providing power to the logic circuit 12, so as to save energy.

A chip always includes a plurality of logic circuits. Please refer to FIG. 2, which illustrates a schematic diagram of a prior art layout of a chip 20. The chip 20 includes a plurality of logic circuits. In the chip 20, a switch circuit 22 is used to provide power to a logic circuit 24. According to different requirements and according to the logic circuit 24 used, the switch circuit 22 can be one of many different designs of power switches. Then, depending on a type of the switch circuit 22 and available areas near the logic circuit 24, the switch circuit 22 is set beside the logic circuit 24. However, the prior art layout does not take account of the effect of the switch circuit 22 on the chip 20. That is, the prior art layout positions the switch circuit 22 while only considering the design of the switch circuit 22 and available areas in the chip 20, but without considering the effect of the switch circuit 22 on the chip 20.

SUMMARY OF INVENTION

It is therefore a primary objective of the claimed invention to provide a method for forming an electric device having power switches around a logic circuit.

The present invention discloses a method for forming an electric device having power switches around a logic circuit. First, a logic circuit is formed on a substrate. Then, a plurality of power switches are formed around the logic circuit. And, first ends of the power switches are coupled to a voltage end. Finally, second ends of the power switches are coupled to a power receiver of the logic circuit.

The present invention further discloses an electric device. The electric device comprises: a substrate, a logic circuit on the substrate, and a plurality of power switches around the logic circuit. First ends of the power switches are coupled to a voltage end. Second ends of the power switches are coupled to a power receiver of the logic circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
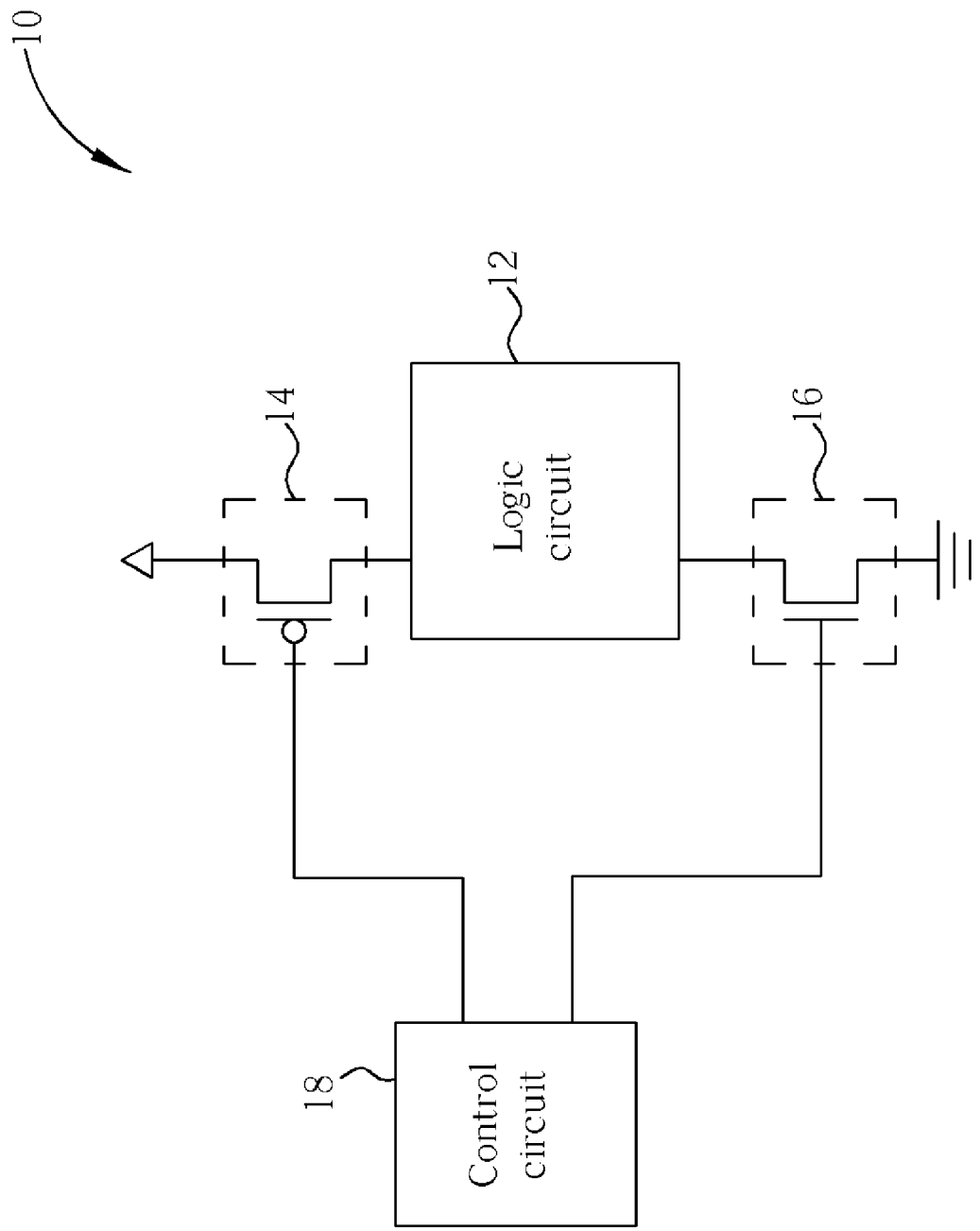
FIG. 1 illustrates a schematic diagram of a prior art layout of power switches.
Figure 2:
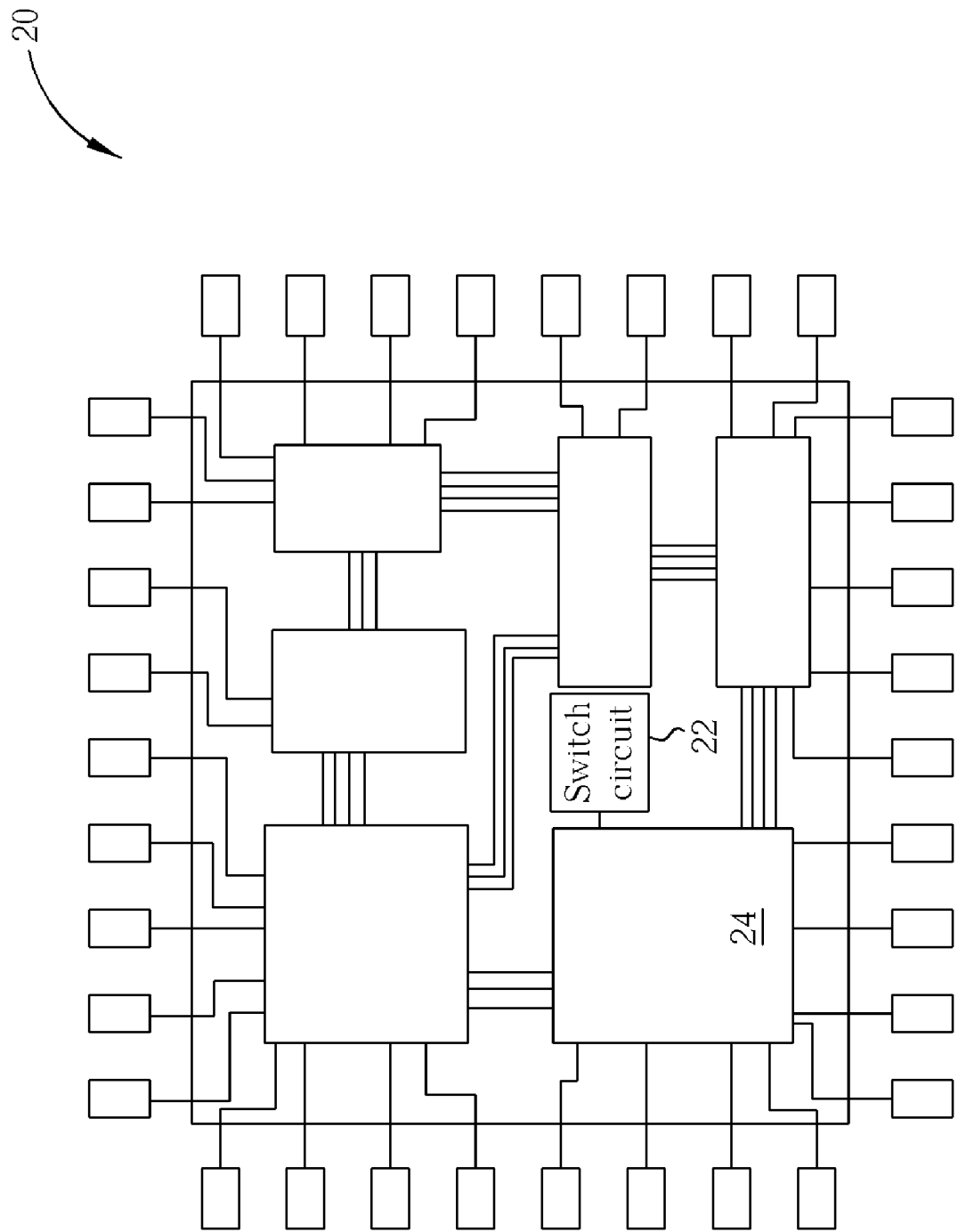
FIG. 2 illustrates a schematic diagram of a prior art layout of a chip.
Figure 3:
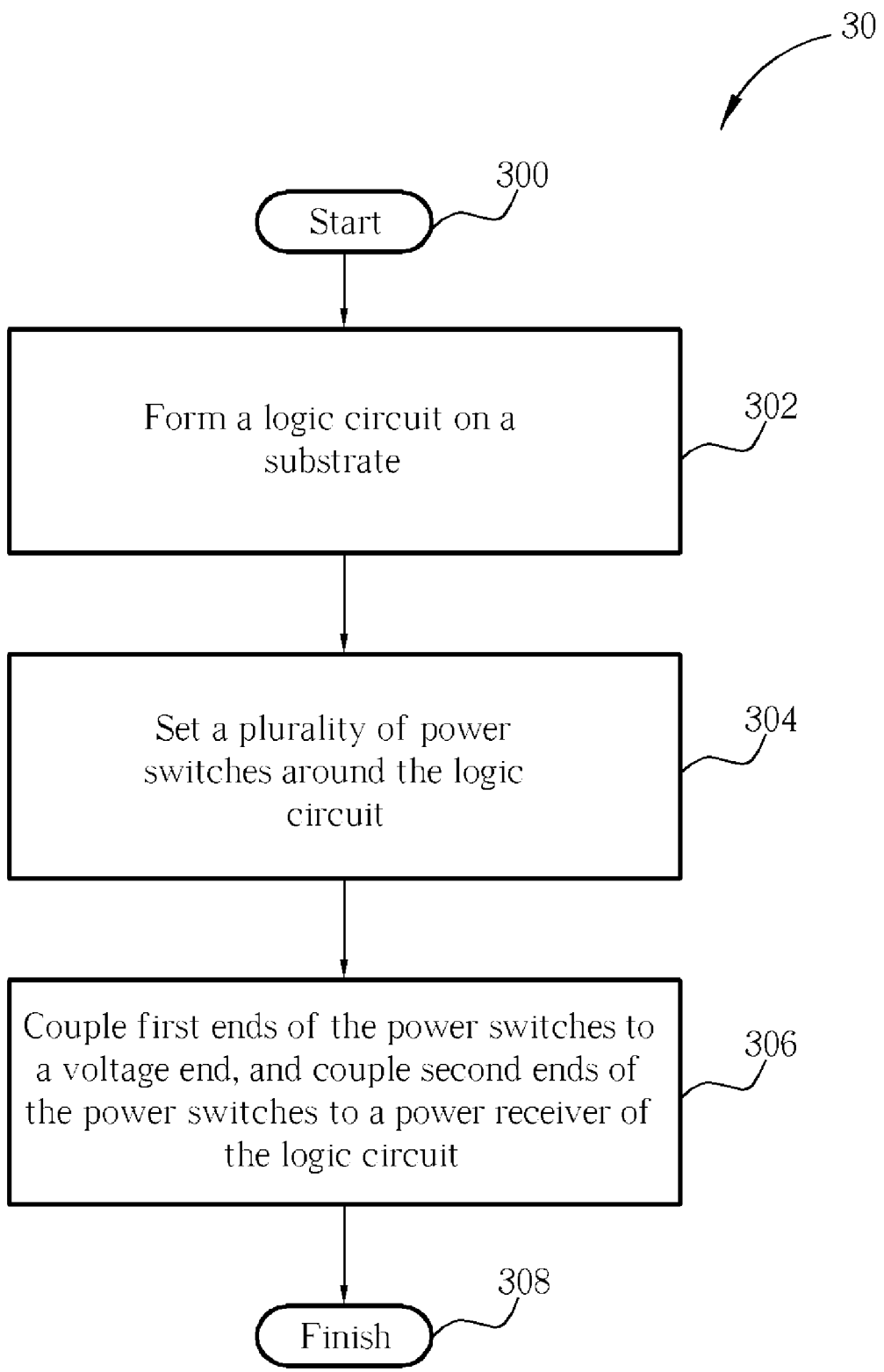
FIG. 3 illustrates a flowchart of a process in accordance with the present invention.

Please refer to FIG. 3, which illustrates a flowchart of a process 30 for forming an electric device having power switches around a logic circuit in accordance with the present invention. The process 30 includes following steps:

Step 300: start.

Step 302: form a logic circuit on a substrate.

Step 304: set a plurality of power switches around the logic circuit.

Step 306: couple first ends of the power switches to a voltage end, and couple second ends of the power switches to a power receiver of the logic circuit.

Step 308: finish.

According to the process 30, the present invention can set power switches around a logic circuit. The process 30 can be performed in different chips, and especially in those chips in which logic circuits have been formed but which have not yet had power switches formed. The present invention can simplify manufacturing procedures of the power switches, and decreases the effects of capacitance and inductance by setting the power switches around the logic circuits. In addition, the present invention process 30 may include a step of forming a control circuit on the substrate for controlling the power switches.

Figure 4:
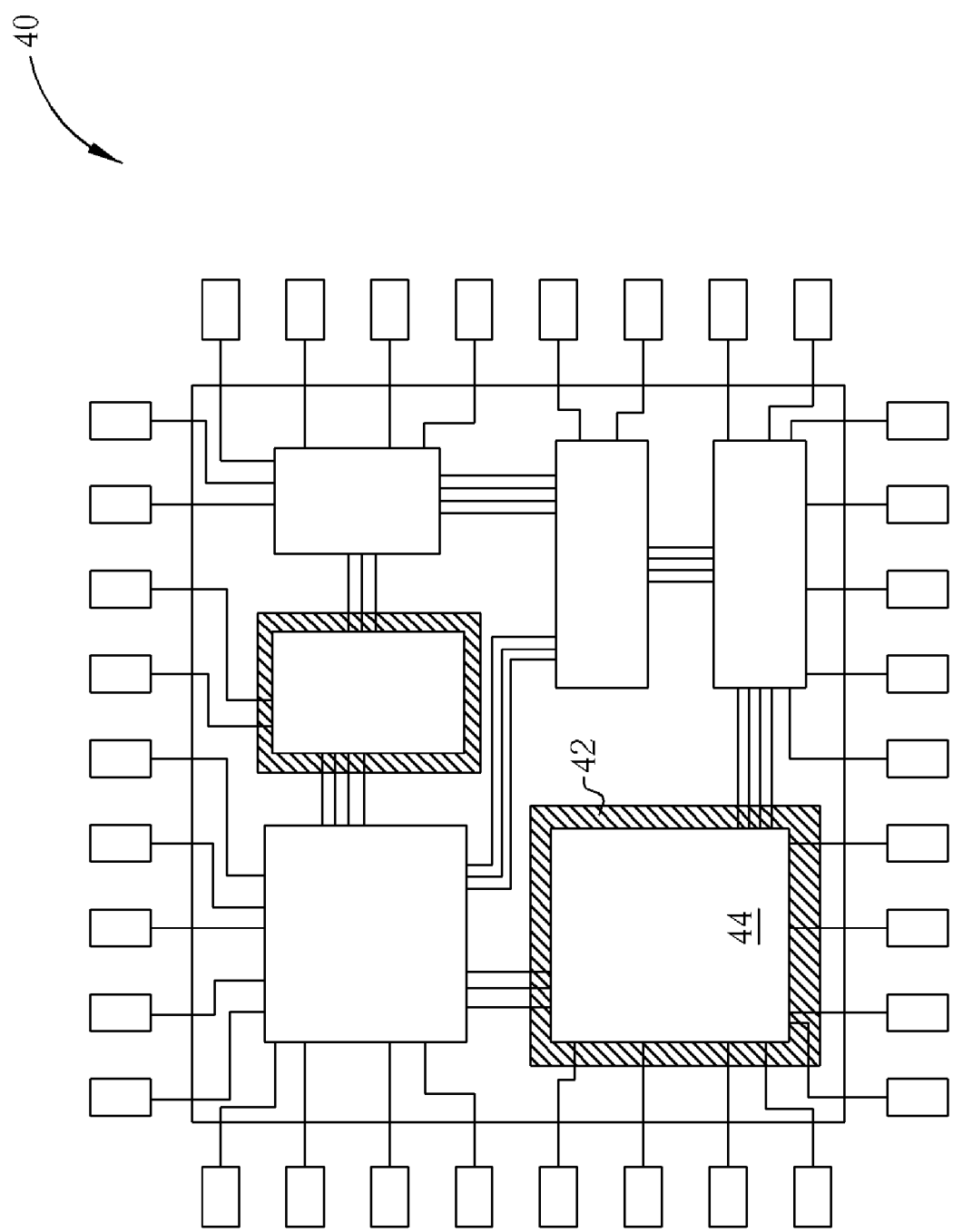
FIG. 4 illustrates a schematic diagram of a chip in accordance with the present invention.

Please refer to FIG. 4, which illustrates a schematic diagram of a chip 40 in accordance with the process 30. The chip 40 includes a plurality of logic circuits, and a power switch circuit 42 controls the power supply for a logic circuit 44. As shown in FIG. 4, the power switch circuit 42 surrounds the logic circuit 44. Therefore, without changing a layout of the chip 40, the power switch circuit 42 can be formed around the logic circuit 44.

Figure 5:
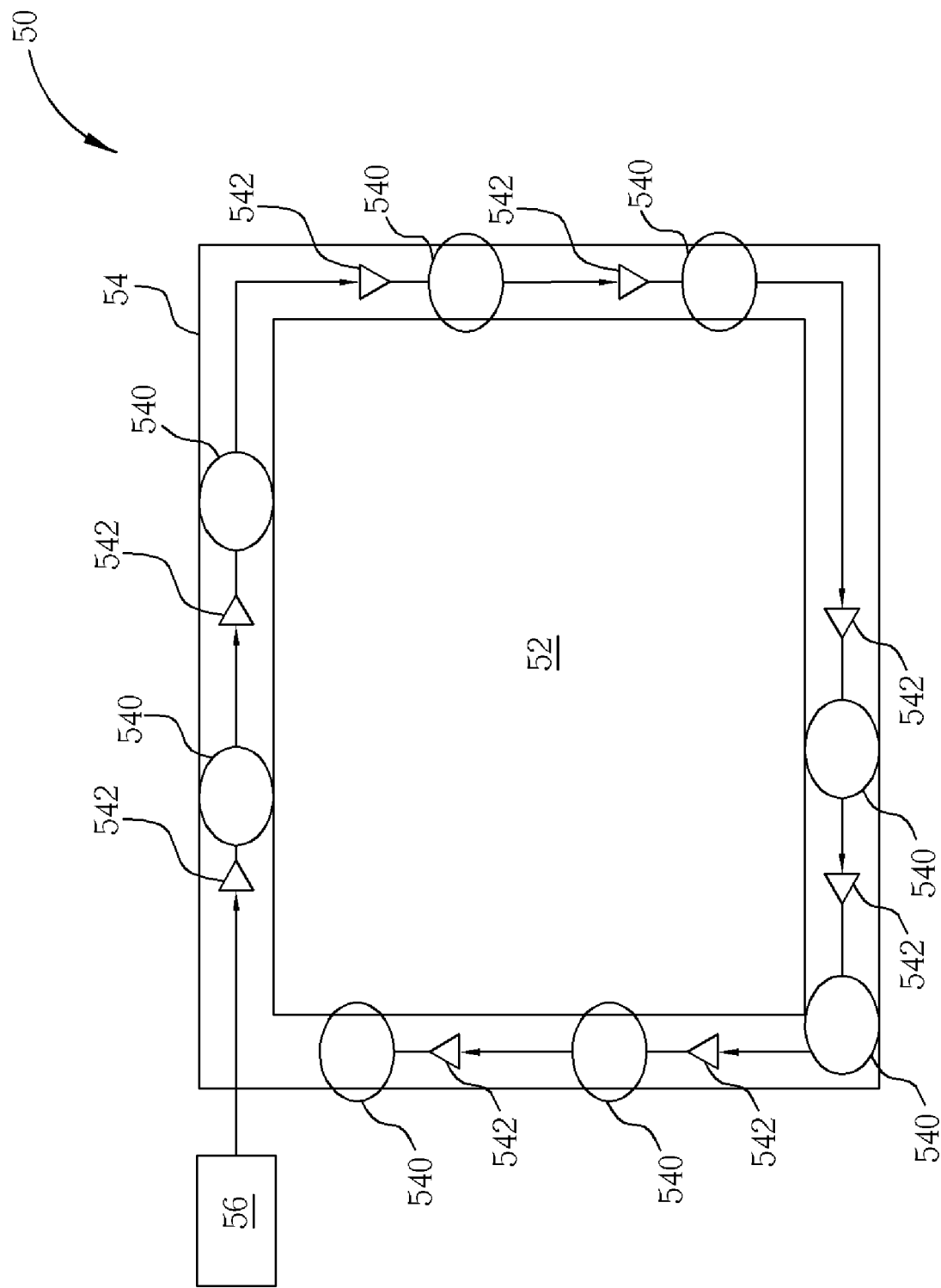
FIG. 5 illustrates a schematic diagram of a layout of serial power switches.

In one implementation, a exemplary layout 50 of serial power switches is shown in FIG. 5. The layout 50 includes a logic circuit 52, a serial switch circuit 54, and a control circuit 56. The layout 50 can be a layout of a logic circuit in a chip. The control circuit 56 controls the serial switch circuit 54 to provide power for the logic circuit 52. As shown in FIG. 5, the serial switch circuit 54 includes a plurality of power switches 540 and a plurality of sleep control circuits 542 integrated in a sequence. Each of the power switches 540 and each of the sleep control circuits 542 correspond to different parts of the logic circuit 52, so the power switches 540 and the sleep control circuits 542 receive signals from the control circuit 56 sequentially, and turn on or turn off accordingly. Because the power switches 540 and the sleep control circuits 542 are set around the logic circuit 52, the effects of capacitance and inductance can be reduced. In comparison, the prior art, which is not systematized, must form power switches and control circuits corresponding to different parts of the logic circuit, causing capacitance and inductance. However, the present invention sets the serial switch circuit 54 around the logic circuit 52, and controls the power switches 540 and the sleep control circuits 542 of the serial switch circuit 54 with the control circuit 56 sequentially. Moreover, the present invention process 30 can be applied to logic circuits in different chips, which simplifies manufacturing procedures of the power switches and decreases the effects of capacitance and inductance.

Figure 6:
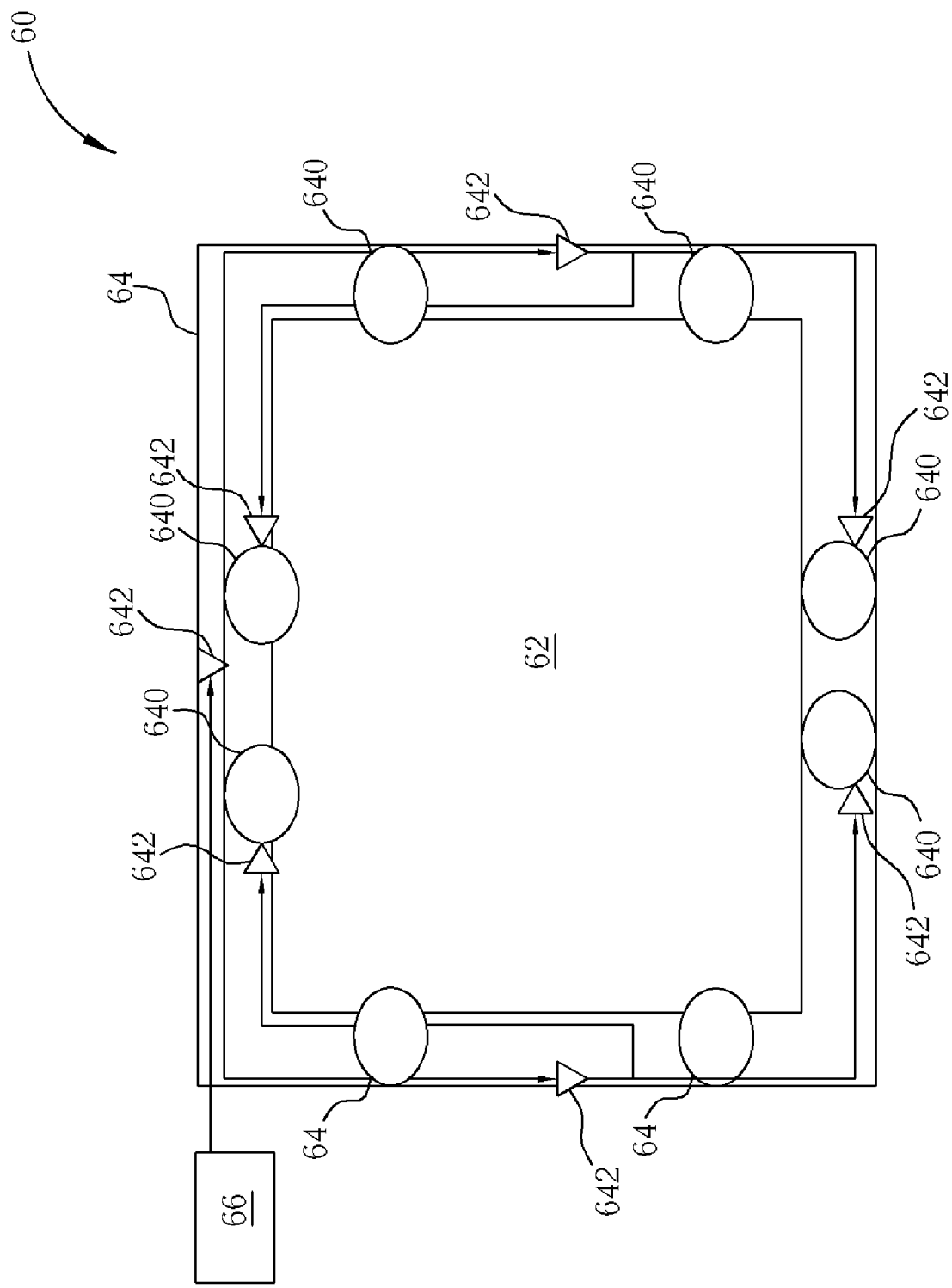
FIG. 6 illustrates a schematic diagram of a layout of tree-like power switches in accordance with the present invention.

In another implementation, a layout 60 of tree-like power switches in accordance with the present invention is shown in FIG. 6. The layout 60 includes a logic circuit 62, a tree-like switch circuit 64, and a control circuit 66. The layout 60 can be a layout of a logic circuit in a chip. The control circuit 66 controls the tree-like switch circuit 64 to provide power for the logic circuit 62. As shown in FIG. 6, the tree-like switch circuit 64 includes a plurality of power switches 640 and sleep control circuits 642. Each of the power switches 640 and each of the sleep control circuits 642 correspond to different parts of the logic circuit 62. The control circuit 66 controls the power switches 640 and the sleep control circuits 642 along branches. As shown in FIG. 6, the power switches 640 and the sleep control circuits 642 surround the logic circuit 62, so that the capacitance effect can be decreased.

Figure 7:
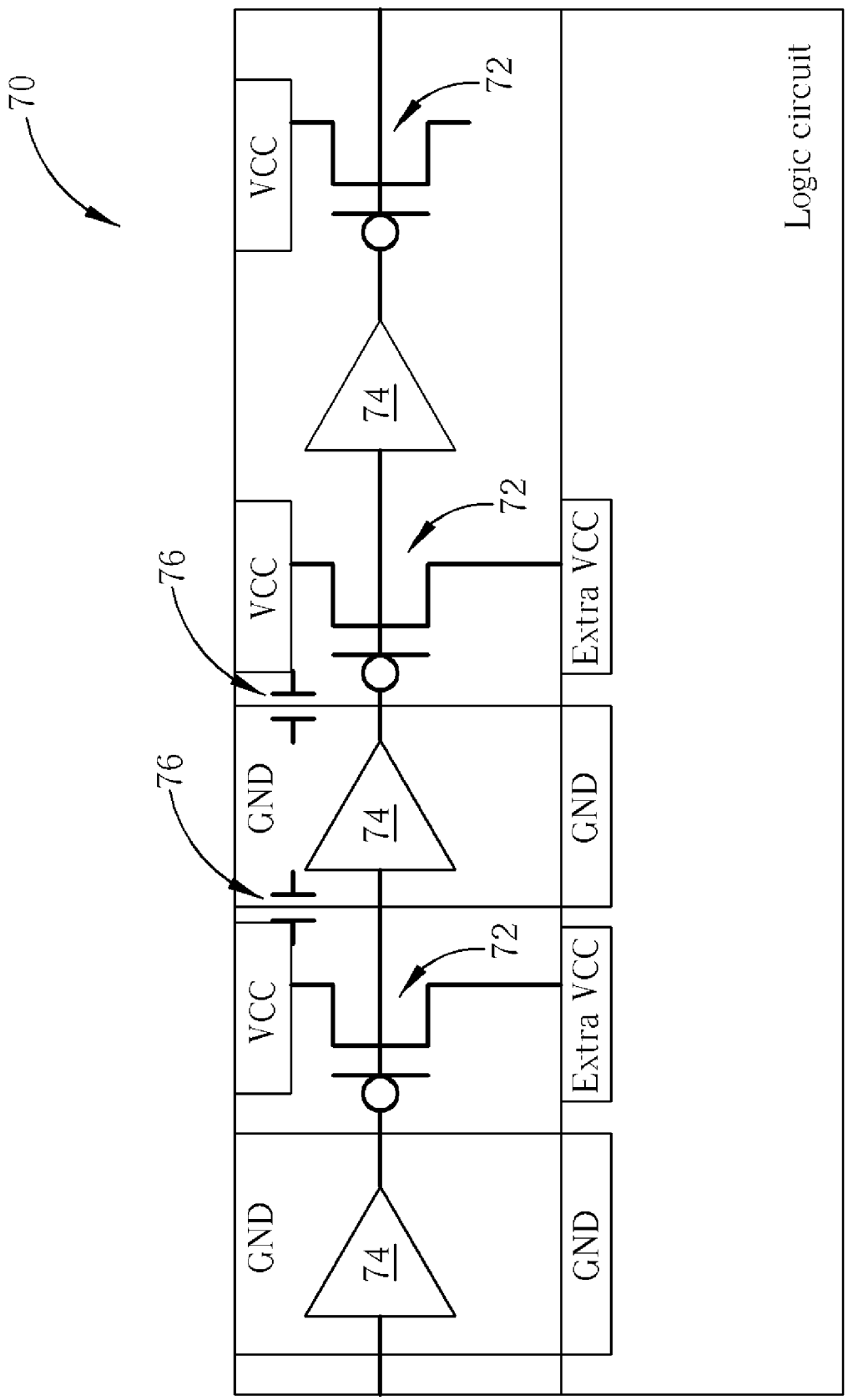
FIG. 7 illustrates a schematic diagram of a switch circuit in accordance with the present invention.

As mentioned above, the power switch circuit 42 in FIG. 4 can be formed by other structures. In one embodiment, a switch circuit 70 is shown in FIG. 7. The switch circuit 70 includes a plurality of p-type MOS transistors 72, a plurality of sleep control circuits 74, and a plurality of decoupling capacitors 76. Each p-type MOS 72 corresponds to a power source of a logic circuit, and each sleep control circuit 74 corresponds to a ground end of the logic circuit. The decoupling capacitors 76 set between the power source and the ground end are used for decreasing the effect of capacitance.

In summary, the present invention can be applied for different chips, and especially for those chips that have been designed completely. The present invention simplifies the manufacturing procedure of power switches in a chip and reduces effect of capacitance and inductance by setting the power switches around a logic circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming an electric device having power switches around a logic circuit comprising following steps:

(a) forming a logic circuit on a substrate;
(b) forming a plurality of power switches around the logic circuit;
(c) coupling first ends of the power switches to a voltage end, and coupling second ends of the power switches to a power receiver of the logic circuit;
(d) forming a control circuit on the substrate and electrically connected to the power switches; and
(e) sequentially sending control signals from the control circuit to the power switches for controlling the power switches in sequence.

2. The method of claim 1, wherein in step (b), the power switches are set in a series connection around the logic circuit.

3. The method of claim 1, wherein in step (b), the power switches are set in a tree-like structure around the logic circuit.

4. The method of claim 1, wherein in step (c), the first ends of the power switches are coupled to a high voltage end, and the second ends of the power switches are coupled to the power receiver of the logic circuit.

5. The method of claim 4, wherein the high voltage end is a power source of the electric device.

6. The method of claim 1, wherein in step (c), the first ends of the power switches are coupled to a low voltage end, and the second ends of the power switches are coupled to the power receiver of the logic circuit.

7. The method of claim 6, wherein the low voltage end is a ground of the electric device.

8. The method of claim 1, wherein the control circuit controls each of the power switches in sequence.

9. An electric device comprising:

a substrate;
a logic circuit on the substrate;
a plurality of power switches around the logic circuit, first ends of the power switches coupling to a voltage end, second ends of the power switches coupling to a power receiver of the logic circuit; and
a control circuit on the substrate and electrically connected to the power switches for sequentially sending control signals from the control circuit to the power switches for controlling the power switches in sequence.

10. The electric device of claim 9, wherein the power switches are set in a series connection around the logic circuit.

11. The electric device of claim 9, wherein the power switches are set in a tree-like structure around the logic circuit.

12. The electric device of claim 9, wherein the first ends of the power switches are coupled to a high voltage end.

13. The electric device of claim 12, wherein the high voltage end is a power source of the electric device.

14. The electric device of claim 9, wherein the first ends of the power switches are coupled to a low voltage end.

15. The electric device of claim 14, wherein the low voltage end is a ground of the electric device.

16. The electric device of claim 9, wherein the control circuit controls each of the power switches in sequence.

* * * * *